US008437988B2

(12) United States Patent
Fang

(10) Patent No.: US 8,437,988 B2
(45) Date of Patent: May 7, 2013

(54) METHOD AND SYSTEM FOR PROCESSING OF THRESHOLD-CROSSING EVENTS

(75) Inventor: Gang Peter Fang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 897 days.

(21) Appl. No.: 12/492,714

(22) Filed: Jun. 26, 2009

(65) Prior Publication Data
US 2009/0326882 A1 Dec. 31, 2009

Related U.S. Application Data

(60) Provisional application No. 61/076,334, filed on Jun. 27, 2008.

(51) Int. Cl.
G06F 7/60 (2006.01)
G06F 17/50 (2006.01)
G06G 7/62 (2006.01)

(52) U.S. Cl.
USPC .................................. 703/2; 703/13; 703/14

(58) Field of Classification Search ................ 703/2, 13, 703/14
See application file for complete search history.

(56) References Cited

U.S. PATENT DOCUMENTS 8,200,467 B1 * 6/2012 Cai et al. .......................... 703/13
2009/0228250 A1 * 9/2009 Phillips ............................. 703/2

OTHER PUBLICATIONS

IEEE Transactions on Computer-Aided Design of Integrated Circuits and Systems, vol. 23, No. 7, Jul. 2004. "Computation of Signal-Threshold Crossing Times Directly From Higher Order Moments". Yehea I. Ismail and Chirayu S. Amin.*
IEEE Transactions on Advanced Packaging, vol. 32, No. 2, May 2009 517. "Multiple Scales Method in VLSI Interconnects Threshold Crossing Time Calculation". Agnieszka Ligocka, Student Member, IEEE, and Wojciech Bandurski, Member, IEEE.*
"Implementation and Evaluation of a Protocol for Detecting Network-Wide Threshold Crossing Alerts". Wuhib, et al. IEEE 2006.*
Fang, G. Peter, "An Efficient Method to Simulate Threshold-Crossing Events," Behavioral Modeling and Simulation Workshop, 2008, IEEE International, Sep., 2008, pp. 96-99.
McCalla, William J., "Fundamentals of Computer-Aided Circuit Simulation," Kluwer Academic Publishers, Boston, 1988, p. 87.
"Are your AMS behavioral modeling challenges surmountable?," an interview with Ron Vogelsong, Jan. 2005, cdnusers.org, p. 1.

(Continued)

*Primary Examiner* — Omar Fernandez Rivas
*Assistant Examiner* — Nithya J Moll
(74) *Attorney, Agent, or Firm* — Lawrence J. Bassuk; W. James Brady; Frederick J. Telecky, Jr.

(57) ABSTRACT

Methods, computer systems, and computer readable media are provided for simulation of a model of a system by detecting a violation of a cross condition while iteratively refining a first solution of a system of nonlinear algebraic equations at a current time point, and responsive to the detecting, predicting a crossing time step, projecting an initial guess for a second solution of the system of nonlinear algebraic equations at the crossing time point, and iteratively refining the second solution and the crossing time step by jointly solving an equation for the cross condition with the system of nonlinear algebraic equations as a coupled nonlinear system in which the crossing time step is treated as an unknown to compute changes to the second solution and the crossing time step in each iteration.

20 Claims, 4 Drawing Sheets

OTHER PUBLICATIONS

"Verilog-AMS Language Reference Manual, Analog & Mixed-Signal Extensions to Verilog HDL," Version 2.2, Accellera, Napa, CA, Nov. 2004, pp. 1-410.

"Creating Analog Behavioral Models, Verilog-AMS Analog Modeling," Cadence Design Systems, Feb. 2003, pp. 1-22.

* cited by examiner

METHOD AND SYSTEM FOR PROCESSING OF THRESHOLD-CROSSING EVENTS

CLAIM OF PRIORITY UNDER 35 U.S.C. 119(e)

The present application claims priority to and incorporates by reference U.S. Provisional Patent Application No. 61/076,334 filed Jun. 27, 2008, entitled "Efficient Method to Simulate Threshold Crossing Events".

BACKGROUND OF THE INVENTION

Computer-based simulation enables the analysis of complex systems before the time and expense of actually implementing the systems is incurred. In general, a simulator is a software application that analyzes a system (e.g., a circuit design) based upon a description of that system to predict the behavior of the system under a given set of conditions or assumptions. Typically, the system description is made up of equations describing the desired behavior of the system. The simulator solves these equations in the context of simulated conditions represented by stimuli applied to the system in order to simulate operation of the system under those conditions.

A circuit simulator typically constructs circuit equations from mathematical models of the components in a circuit. The mathematical models may be provided in the circuit simulator (e.g., the semiconductor device models of SPICE-like simulators), and/or may be specified by a user using a hardware description language (e.g., Verilog-AMS, Verilog-A). The circuit simulator combines the mathematical models of the components with equations that describe the interconnection of the components to construct a set of nonlinear differential algebraic equations (DAEs) that describe the circuit. In many circuit simulators, the interconnection equations are derived from Kirchoff's voltage and current laws which require that the sum of all currents flowing out of a node at any instant is zero and the algebraic sum of all branch voltages around a loop at any instant is zero.

A circuit simulator may be used to perform many different types of analysis on a circuit, e.g., transient analysis, DC analysis, AC analysis, harmonic balance analysis, Monte Carlo analysis, mismatch analysis and parametric analysis, corners analysis, etc. For a transient analysis, the circuit simulator computes the response of a circuit as a function of time. To perform the transient analysis, the differential algebraic equations (DAEs) describing the circuit are discretized in time to convert the solution of the equations into a problem of solving a sequence of systems of nonlinear algebraic equations (NAEs). In other words, the differential equations are numerically integrated to replace the time derivative operator with a discrete-time approximation and the resulting finite-difference equations are solved one time point at a time starting from some initial condition. Four integration methods commonly used in circuit simulation include trapezoidal rule, forward Euler, backward Euler, and backward difference formulas (i.e., Gear's methods).

More specifically, transient analysis determines the time domain response of the circuit over a time interval [0, T]. The transient solution to the system of differential equations is computed by dividing this time interval into discrete time points $[0, t_1, t_2, \ldots, T]$, and applying a numerical integration algorithm at each time point to transform the differential equations into equivalent algebraic equations. The circuit simulator solves these nonlinear algebraic equations (NAEs) on every time point of a transient analysis. The solution to the NAEs is obtained by executing an iterative sequence of linearized solutions. The Newton-Raphson method, i.e., the Newton method or Newton iteration, is the most common method of linearization used. The Newton-Raphson method begins with an initial guess for the solution to the NAEs. The NAEs are then linearized about that guess, and the resulting linear system is solved. One common technique used to solve such a linear system in circuit simulators is LU factorization. LU factorization is a modified version of Gaussian elimination. The linear equations of the linear system are represented as a circuit matrix, i.e., a modified nodal analysis (MNA) circuit matrix which is typically a Jacobian matrix, and the matrix is factorized into a product of lower- and upper-triangular matrices. Then, forward and backward substitutions are performed to obtain the solution. Once the solution is obtained, the NAEs are then re-linearized about the solution and the procedure repeats until the process converges.

Threshold-crossing events (i.e., cross events) are widely used in transient analysis. In general, a cross event is an event that is fired during simulation whenever the result of evaluating an expression crosses through a threshold (e.g., 0) in a positive and/or negative direction. In essence, a cross event is specified to cause the simulator to generate a time point, i.e., a crossing time point, at the threshold crossing point, i.e., to cause the simulator to solve the circuit equations at the threshold crossing point. For example, the cross function in Verilog-A generates a monitored analog event to detect threshold crossing and is also used in Verilog-AMS for threshold crossing.

One frequently used approach for detecting and resolving a crossing time point during transient analysis is as follows. At each time point, the circuit simulator checks for all cross conditions. If violation of a cross condition is detected (e.g., the result of evaluating an expression crosses through a threshold), the circuit simulator rejects the time point and enters a search mode to attempt to find a time point where the crossing that violated the cross condition is occurring. The circuit simulator iteratively predicts (via interpolation) and solves the crossing point expression(s) until a time point sufficiently close (i.e., within some error tolerance) to the actual time at which the crossing occurs is found. The iterative prediction is typically repeated for 2-4 time points to locate an accurate crossing time point and may require many more time points. Further, the entire circuit or system of equations is evaluated and solved for each of these time points, which is computationally expensive. Therefore, specifying a large number of cross events may significantly impact the performance of a simulation. Accordingly, improvements in the processing of threshold-crossing events are desirable.

SUMMARY OF THE INVENTION

Embodiments of the invention provide for simulation of a model of a system. In general, in one aspect, the invention relates to a method for simulation of a model of a system that includes detecting a violation of a cross condition while iteratively refining a first solution of a system of nonlinear algebraic equations at a current time point, wherein the system of nonlinear algebraic equations is derived from a set of nonlinear differential algebraic equations that describe the system, responsive to the detecting, predicting a crossing time step, wherein the crossing time step is an interval between a previous time point and a crossing time point where the crossing condition was violated, projecting an initial guess for a second solution of the system of nonlinear algebraic equations at the crossing time point, and iteratively refining the second solution and the crossing time step by jointly solving an equation for the cross condition with the system of nonlinear algebraic equations as a coupled nonlinear system in which the crossing time step is treated as an unknown to compute changes to the second solution and the crossing time step in each iteration, and outputting information regarding the second solution and the crossing time point in human readable form.

In general, in one aspect, the invention relates to a computer system that includes a processor and a storage device storing software instructions, wherein when executed by the processor, the software instructions cause the computer system to perform the above described method.

In general, in one aspect, the invention relates to a computer readable medium that includes executable instructions to perform the above described method when executed by a processor.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
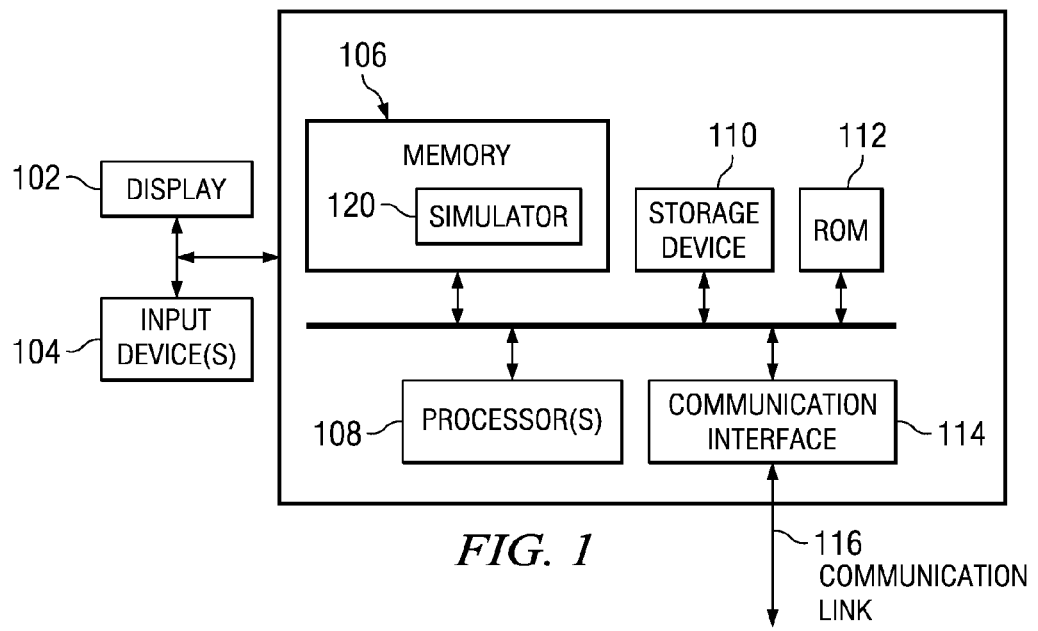
FIG. 1 shows block diagram of a computer system for performing simulation in accordance with one or more embodiments of the invention.

Specific embodiments of the invention will now be described in detail with reference to the accompanying figures. Like elements in the various figures are denoted by like reference numerals for consistency.

Certain terms are used throughout the following description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Further, any reference to "the invention" herein is not intended to be construed as a generalization of any inventive subject matter disclosed herein nor to be considered as an element or limitation of the appended claims except where explicitly recited in a claim(s).

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. In addition, although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

In general, embodiments of the invention provide methods and systems for processing of threshold crossing events in a simulator. More specifically, embodiments of the invention provide an approach to generating a crossing time point that includes solving the equations for a cross condition jointly with the discretized differential algebraic equations (DAEs) describing the simulated system as one nonlinear system in which the time step for the crossing time point is treated as an unknown. Thus, the approach directly converges to the crossing time point without requiring computation of potential solutions at multiple time points as required in prior art approaches. Some embodiments of the invention also provide an approach for detecting the violation of cross conditions using polynomial interpolation rather than the linear interpolation used in prior art approaches.

FIG. 1 shows a block diagram of a computer system for performing simulation in accordance with one or more embodiments of the invention. Although only a single computer system is presented and described, any number of such computer systems may be connected, e.g., using communication interface 116, to execute embodiments of the simulation methods described herein. Further, while FIG. 1 illustrates various components of a computer system, representation of a particular architecture is not intended and embodiments of the invention are not limited to the example architecture shown. In addition, embodiments of the invention may be used on computing systems having fewer or more components than those shown.

As shown in FIG. 1, a computer system includes one or more processors 108, a storage device 110, memory 106, read-only memory (ROM) 112, and a communication interface 114 interconnected by an internal bus. The storage device 110 is a non-volatile memory device, e.g., a magnetic or optical disk, which maintains data even when power is removed from the computer system. While FIG. 1 shows storage device 110 as a local device coupled directly to the rest of the components in the computer system, the storage device 110 may be remote from the system, i.e., coupled to the computer system through the communication interface 114. The ROM 112 may store static data and/or instructions for the processor(s) 108. The computer system also includes a display 102 and input device(s) 104 such as a keyboard and a mouse (or other cursor control device) connected to the internal bus. The communication interface 114 provides two-way communication with other computer systems via a communication link 116. The communication link 116 may be, for example, a local area network, an integrated services digital network, a cellular network, and/or a wide area network.

The simulator 120 may be stored on the storage device 110 and read into the memory 106 to be executed by the processor(s) 108. In one or more embodiments of the invention, the simulator 120 may be used to test and validate models of systems. More specifically, the simulator 120 includes functionality to construct a set of nonlinear differential algebraic equations (DAEs) describing the system from the model. The simulator 120 also included functionality to perform different types of analyses on the system including transient analysis in which the response of the system is computed as a function of time. To perform the transient analysis, the differential algebraic equations (DAEs) describing the system are discretized in time to convert the solution of the equations into a problem of solving a sequence of systems of nonlinear algebraic equations (NAEs). In other words, the differential equations are numerically integrated to replace the time derivative operator with a discrete-time approximation and the simulator 120 solves the resulting finite-difference equations one time point at a time starting from some initial condition. The simulator 120 also includes functionality to output for each time point any information a user may have requested about a time point. The outputting may include, for example, storing the requested information on the storage device 110 and/or providing the information to another software application using the communication interface 114 and/or displaying the information in human readable form (e.g., on paper or on the display 102).

Further, the simulator 120 includes functionality to detect threshold crossing events defined in a system model and to determine the time points of the crossings that triggered the events and the solutions to the NAEs at these timepoints, the functionality including performing one or more embodiments of the methods described herein. A threshold crossing event, i.e., a cross event, is an event occurring during simulation whenever a specified cross condition is violated, e.g., the result of evaluating an expression crosses through a threshold (e.g., 0) in a positive and/or negative direction.

A computer readable medium may be used to store software instructions and data which when executed by the computer system causes the system to perform embodiments of the methods described herein. A computer readable medium is any mechanism that stores information in a form accessible by a computer system, such as, for example, ROM, random access memory (RAM), magnetic disk storage, optical storage media, flash memory, etc. In some embodiments of the invention, a computer readable medium may also be electrical, optical, acoustical, or other forms of propagated signals (e.g., carrier waves, infrared signals, digital signals, etc.).

FIGS. 2A-2D show a method for simulation in accordance with one or more embodiments of the invention. Embodiments of the method are presented and described using circuit simulation as an example. However, one of ordinary skill in the art will understand other embodiments in which the system under simulation may be any system that can be described with a set of nonlinear differential algebraic equations, such as a mechanical system, a biological system, etc. Accordingly, the scope of the invention should not be considered limited to circuit simulation.

For simulation purposes, a circuit model is described using a hardware description language. In describing these methods, certain terminology from one hardware description language may be used in describing the methods for ease of explanation. Definitions for these terms are taken from the Verilog-AMS Language Reference. However, one of ordinary skill in the art will appreciate that different terminology may be used in other hardware description languages without departing from the described functionality. As used below, a circuit model is represented as one or more system. A system is a collection of interconnected components that produces a response when acted upon by a stimulus. A component is fundamental unit within a system that encapsulates behavior and structure. A hierarchical system is a system in which the components are also systems. A leaf component is a component with no subcomponents that connects to zero or more nets.

Each net connects to a signal which can traverse multiple levels of the hierarchy. The behavior of each component is defined in terms of the values of the nets to which it connects. A signal is a hierarchical collection of nets which, because of port connections, are contiguous. If all the nets that make up a signal are in the discrete domain, the signal is a digital signal. If all the nets that make up a signal are in the continuous domain, the signal is an analog signal. A signal that consists of nets from both domains is called a mixed signal. Similarly, a port whose connections are both analog is an analog port, a port whose connections are both digital is a digital port, and a port with one analog connection and one digital connection is a mixed port. The components interconnect through ports and nets to build a hierarchy. A node is a point of physical connection between nets of continuous-time descriptions. A branch is a path between two nodes. Nodes obey conservation-law semantics. A conservative system is one that obeys the laws of conservation described by Kirchhoff's Potential and Flow laws. In a conservative system, each node has two values associated with it: the potential of the node and the flow out of the node. Each branch in a conservative system also has two associated values: the potential across the branch and the flow through the branch.

The method for circuit simulation illustrated in FIGS. 2A-2D includes the generation of a crossing time point in response to the detection of a threshold crossing event specified in a model of a circuit. A threshold crossing event occurs when a cross condition associated with the event is violated during simulation. In one or more embodiments of the invention, generating a crossing time point after a violation of a cross condition is detected includes solving the equations for the cross condition jointly with the circuit equations as one nonlinear system i.e., a coupled nonlinear system, in which the time step from the time point accepted immediately prior to the violation of the cross condition, i.e., the previous time point, to the crossing time point is treated as an unknown. A time step is the interval between two sequential time points. The derivation of the coupled nonlinear system and the resulting equations for solving the circuit equations and for determining the unknown time step are first explained before describing the circuit simulation method that uses these equations.

As shown in Eq. (1), modified nodal analysis (based on Kirchhoff's laws) of a mathematical model of a circuit is used to construct a system of N differential algebraic equations (DAEs) that are solved to analyze the behavior of the circuit, $$\bar{f}_{ckt}(\bar{v}(t)) = \frac{d}{dt}\bar{q}(\bar{v}(t)) + \bar{\imath}(\bar{v}(t)) + \bar{u}(t) = 0, \tag{1}$$

where $\bar{u} \in R^N$ is the vector of input sources, $\bar{v} \in R^N$ is the vector of solution variables, and $\bar{\imath}, \bar{q} \in R^N$ are the vectors of resistive currents and node charges/branch fluxes. $R^N$ is a real N-dimensional vector space and an element of $R^N$ can be written as $\bar{v} = (v_1, v_2, \ldots, v_N)$. An input source (also referred to as an input signal) is an input voltage or current stimulus signal. A solution variable is a circuit signal, e.g., a voltage or a current, which represents an unknown in the circuit equations.

To perform transient analysis, the time derivative term of the DAEs is discretized using a time integration scheme such as the trapezoidal rule, forward Euler, backward Euler, and backward difference formulas (i.e., Gear's methods). For purposes of explanation, only discretization using backward Euler is described. However, one of ordinary skill in the art will understand that other time integration schemes may be used. Accordingly, embodiments of the invention should not be limited to discretization using backward Euler. In one or more embodiments of the invention, the backward Euler time integration scheme, $$\frac{d}{dt}\bar{q}(\bar{v}_m) \approx \frac{\bar{q}(\bar{v}_m) - \bar{q}(\bar{v}_{m-1})}{h_m}$$

where m is the time index and $h_m$ is a time step at time index m, is used to discretize the time derivative term of the DAEs. The resulting system of nonlinear algebraic equations (NAEs) is shown in Eq. (2).

$$\bar{f}_{ckt}(\bar{v}_m) = \frac{\bar{q}(\bar{v}_m) - \bar{q}(\bar{v}_{m-1})}{h_m} + \bar{i}(\bar{v}_m) + \bar{u}_m = 0 \quad (2)$$

A cross condition of a threshold crossing event is defined as an explicit equation of solution variables, i.e., node voltages and branch currents as shown in Eq. (3).

$$f_{cross}(\bar{v}_m) = 0 \quad (3)$$

The coupled nonlinear system of the discretized circuit equations, i.e., the NAEs, and the cross condition equation of Eq. (3) in which the time step $h_m$ is treated as an independent variable or unknown is expressed as shown in Eqs. (4) and (5), $$\begin{cases} \bar{f}_{ckt}(\bar{v}_m, h_m) = 0 \\ f_{cross}(\bar{v}_m) = 0 \end{cases} \quad (4)$$

or $$\bar{F}_{coupled}(\bar{v}_m, h_m) = 0 \quad (5)$$

where $\bar{F}_{coupled} \in R^{N+1}$, i.e., N+1 nonlinear equations are to be solved for N+1 unknowns.

The iterative Newton-Raphson method is then applied to solve the NAEs of the coupled nonlinear system, resulting in Eq. 6, $$\begin{pmatrix} \frac{\partial \bar{f}_{ckt}}{\partial \bar{v}_m} & \frac{\partial \bar{f}_{ckt}}{\partial h_m} \\ \frac{\partial f_{cross}}{\partial \bar{v}_m} & 0 \end{pmatrix} \begin{pmatrix} \Delta \bar{v}_m^{k-1} \\ \Delta h_m^{k+1} \end{pmatrix} = - \begin{pmatrix} \bar{f}_{ckt}(\bar{v}_m^k, h_m^k) \\ f_{cross}(\bar{v}_m^k) \end{pmatrix} \quad (6)$$

where $$\frac{\partial \bar{f}_{ckt}}{\partial \bar{v}_m} \in R^{N \times N},$$

$$\frac{\partial \bar{f}_{ckt}}{\partial h_m} \in R^{N \times 1},$$

and $\frac{\partial f_{cross}}{\partial \bar{v}_m} \in R^{1 \times N}$, and k is the Newton iteration index. Note that $$\bar{J}_{ckt} = \frac{\partial \bar{f}_{ckt}}{\partial \bar{v}_m}$$

is the Jacobian matrix for the linear system formed from the NAEs formed by discretizing the circuit equations, i.e., the DAEs. Both sides of Eq. (6) are then multiplied by $$\begin{pmatrix} \bar{J}_{ckt}^{-1} & 0 \\ 0 & 1 \end{pmatrix}$$

to obtain Eq. (7).

$$\begin{pmatrix} \bar{I}_{N \times N} & \bar{J}_{ckt}^{-1} \frac{\partial \bar{f}_{ckt}}{\partial h_m} \\ \frac{\partial f_{cross}}{\partial \bar{v}_m} & 0 \end{pmatrix} \begin{pmatrix} \Delta \bar{v}_m^{k+1} \\ \Delta h_m^{k+1} \end{pmatrix} = - \begin{pmatrix} \bar{J}_{ckt}^{-1} \bar{f}_{ckt}(\bar{v}_m^k, h_m^k) \\ f_{cross}(\bar{v}_m^k) \end{pmatrix} \quad (7)$$

Gaussian elimination is then performed on Eq. (7) to obtain Eq. (8).

$$\begin{pmatrix} \bar{I}_{N \times N} & \bar{J}_{ckt}^{-1} \frac{\partial \bar{f}_{ckt}}{\partial h_m} \\ 0 & -\frac{\partial f_{cross}}{\partial \bar{v}_m} \left( \bar{J}_{ckt}^{-1} \frac{\partial \bar{f}_{ckt}}{\partial h_m} \right) \end{pmatrix} \begin{pmatrix} \Delta \bar{v}_m^{k+1} \\ \Delta h_m^{k+1} \end{pmatrix} = \\ - \begin{pmatrix} \bar{J}_{ckt}^{-1} \bar{f}_{ckt} \\ f_{cross}(\bar{v}_m^k) - \frac{\partial f_{cross}}{\partial \bar{v}_m} (\bar{J}_{ckt}^{-1} \bar{f}_{ckt}) \end{pmatrix} \quad (8)$$

Finally, backward substitution is performed on Eq. (8) to obtain the updates, i.e., deltas, for the solution vector $\bar{v}$ and the time step h as shown in Eq. (9) and Eq. (10).

$$\Delta h_m^{k+1} = \frac{f_{cross}(\bar{v}_m^k) + \frac{\partial f_{cross}}{\partial \bar{v}_m} (\bar{J}_{ckt}^{-1}(-\bar{f}_{ckt}))}{\frac{\partial f_{cross}}{\partial \bar{v}_m} \left( \bar{J}_{ckt}^{-1} \frac{\partial \bar{f}_{ckt}}{\partial h_m} \right)} \quad (9)$$

$$\Delta \bar{v}_m^{k+1} = \bar{J}_{ckt}^{-1}(-\bar{f}_{ckt}) + \left( \bar{J}_{ckt}^{-1} \frac{\partial \bar{f}_{ckt}}{\partial h_m} \right) \Delta h_m^{k+1}. \quad (10)$$

Note that the first term $\bar{J}_{ckt}^{-1}(-\bar{f}_{ckt})$ in Eq. (10) is the solution of the circuit equations when the time step is not treated as an unknown and the second term is the solution when the time step is treated as unknown. Further, the term $$\bar{J}_{ckt}^{-1} \frac{\partial \bar{f}_{ckt}}{\partial h_m}$$

can be obtained by standard forward and backward substitutions of the circuit Jacobian matrix after LU factorization.

Figure 2A:
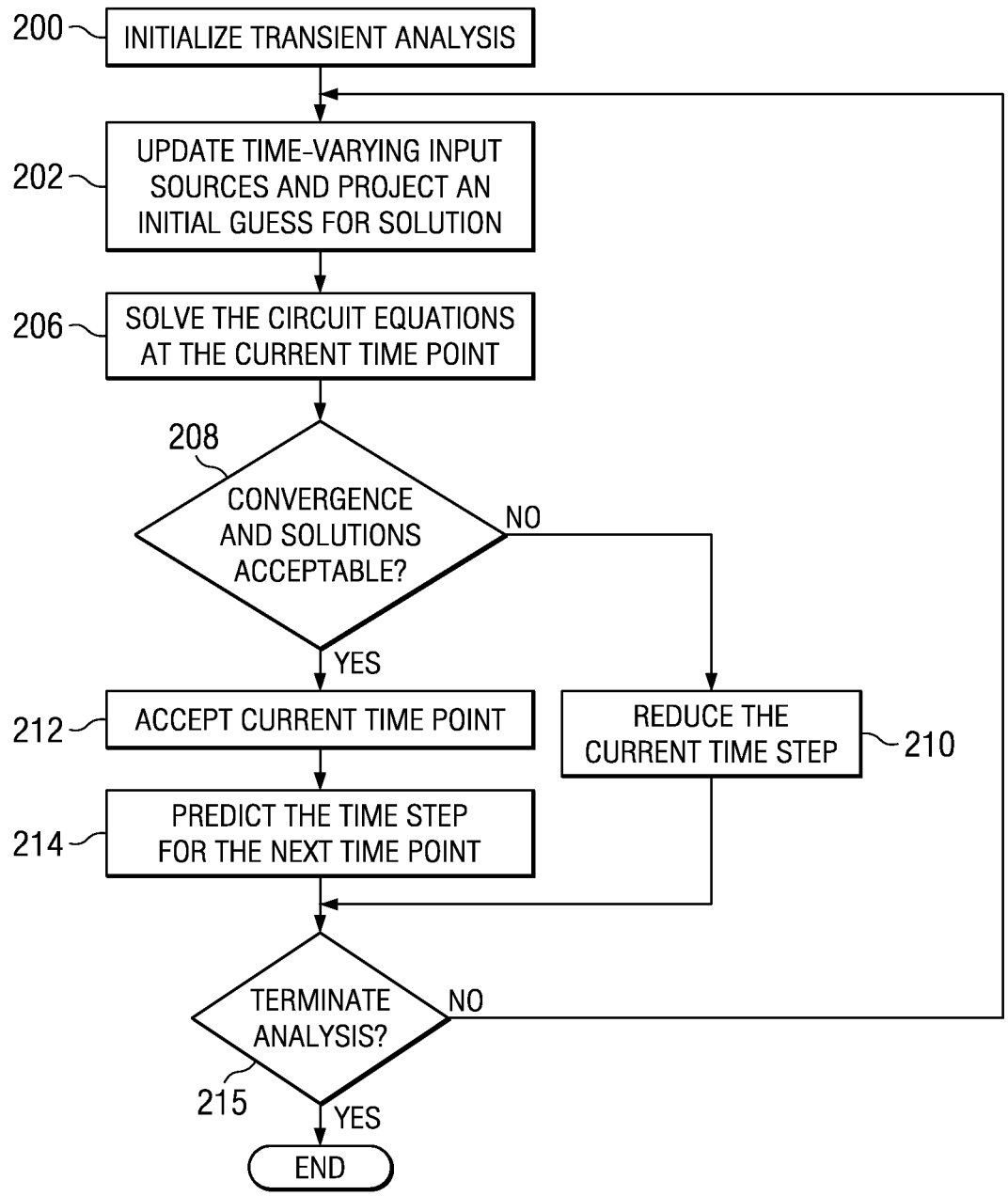
FIGS. 2A-2D are flow diagrams of methods in accordance with one or more embodiments of the invention.

FIG. 2A is a flow diagram of a method for transient analysis of a circuit model in a circuit simulator (e.g., simulation system 120 of FIG. 1) in accordance with one or more embodiments of the invention. The transient analysis is performed over a time interval [0,T] that is computationally divided into discrete time points $t_m$ where m, i.e., the time index, is the number of time points generated during the analysis. The start time and stop time for the time interval may be specified by a user of the simulation system. First, the transient analysis is initialized (200). Modified nodal analysis of the circuit model is used to construct DAEs as per Eq. (1) and the time derivative term of the DAEs is discretized to generate a system of nonlinear algebraic equations (NAEs) as per Eq. (2). The initialization may include predicting an initial time step $h_1$ and generating a solution $\bar{v}_0$ of the circuit equations for the first time point $t_0$ of the analysis for time index m=0. For ease of description, the assumption is made that the analysis begins at $t_o$=0. However, in embodiments of the invention, the analysis may begin at any user-specified time point.

After the transient analysis is initialized, time points are generated, i.e., the NAEs are solved, for each time index m and the transient analysis is terminated 215 when the stop time T is reached. To generate a solution at a time point $t_m$, the time-varying input sources in the input sources $\bar{u}$ are updated to generate the input sources values $\bar{u}_m$, i.e., the input sources vector, and an initial guess for the solution $\bar{v}_m$, i.e., the solution vector, of the NAEs at time point $t_m$ is projected based on these updates and the solution(s) at previous time point(s). Note that at this point in the method, the time point $t_m$ is at a time step $h_m$ predicted either during initialization 200 or after acceptance of the previous time point $t_{m-1}$, 212 or modified 210 if the solution to NAEs for the predicted time step fails to converge or is not acceptable. A time-varying input source is an input stimulus signal, e.g., a voltage or current, having a value that is a function of time. Thus, when the current time point changes, the value of the input source may need to be adjusted. The initial guess for the solution $\bar{v}_m$ may be projected by any suitable means such as, for example, extrapolation.

Once the initial guess for the solution $\bar{v}_m$ is projected, the NAEs are solved at the current timepoint $t_m$ using a Newton-Raphson iterative method that is described in more detail below in reference to FIG. 3B. In general, the Newton-Raphson iterative method takes the initial guess for the solution and refines it iteratively making the guess more and more accurate in each iteration. If the iterative method converges on a solution $\bar{v}_m$ and the solution $\bar{v}_m$ satisfies user-specified requirements (if any) 208, the solution $\bar{v}_m$ for the time point $t_m$ is accepted 212. In one or more embodiments of the invention, acceptance of a time point includes outputting any information, i.e., results, a user has requested for a time point. The outputting may involve, for example, storing the requested results and/or providing the results to another software application and/or displaying the results in human readable form (e.g., on paper or on a display). In addition, any data structures used for generating time points are updated based on the current time point. The time step is then predicted for the next time point 214. The next time point and the solution at the next time point are then generated based on the new time step 202-214 unless some criterion for terminating the analysis has been met 215, such as the stop time for transient analysis has been reached.

If the iterative method does not converge on the solution $\bar{v}_m$ or the solution $\bar{v}_m$ does not satisfy user-specified requirements (if any) 208, the current time step $h_m$ is reduced, i.e., the current time point $t_m$ is moved closer to the previous time point. Another attempt is then made to generate the current time point $t_m$ 202-214 unless some criterion for terminating the analysis has been met 215, such as the current time $h_m$ step being too small.

Figure 2B:
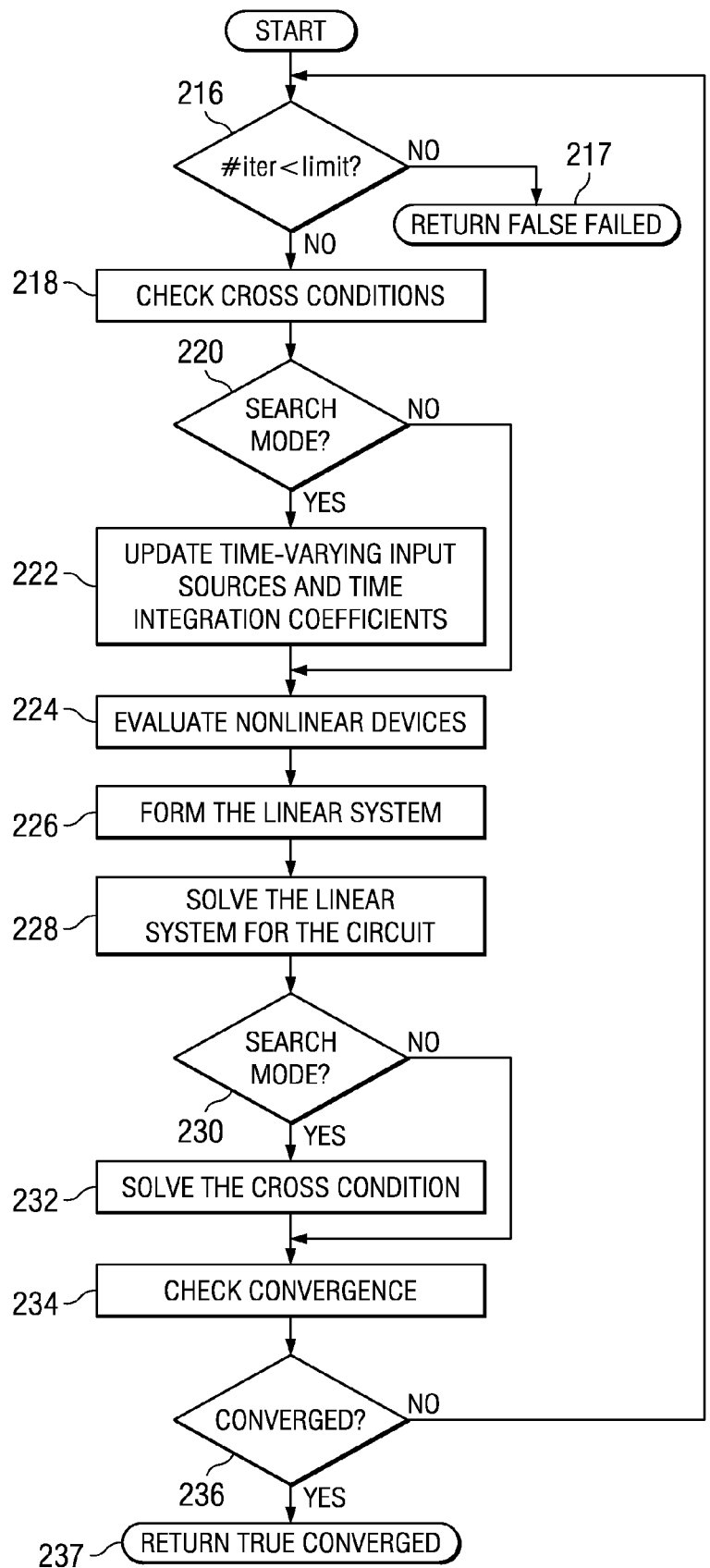

FIG. 2B is a flow graph of a method for solving the circuit equations (expressed as a system of NAEs) at the current time point $t_m$ in accordance with one or more embodiments of the invention. The method is an iterative method based on the Newton-Raphson approach for solving NAEs. In essence, the method attempts to converge on the solution $\bar{v}_m$ at the time point $t_m$. However, if a violation of a cross condition is detected while attempting to converge on the solution $\bar{v}_m$ at the current time point $t_m$, the method changes the current time point $t_m$ to the crossing time point and attempts to converge on the solution $\bar{v}_m$ at the crossing time point, jointly refining the solution $\bar{v}_m$ and the time step $h_m$ of the crossing time point in each iteration.

The method begins with the projected initial guess for the solution $\bar{v}_m$ (202 in FIG. 2A) at the current time point $t_m$ and iterates until either there is convergence to a solution 236 or a predetermined number of iterations k are performed 216. Note that for other than the first iteration, each iteration begins with a solution $\bar{v}_m^k$ computed in the previous iteration based on a time step $h_m^k$. As will become apparent in the description below, the time step $h_m^k$ is the same for each iteration unless a threshold crossing event occurs, i.e., a violation of a cross condition is detected during an iteration. If a violation of a cross condition is detected, the time step $h_m^k$ is subsequently updated in each iteration. If the predetermined number of iterations k are performed before there is convergence to a solution, an indication that no solution was found is returned 217. If there is convergence to a solution, an indication that a solution was found is returned 237

In each iteration k, initially the cross conditions are checked 218. More specifically, a check is made for violations of the cross conditions of threshold crossing events specified in the circuit model. The method for checking cross conditions is described below in reference to FIG. 2C. As is explained in more detail in reference to FIG. 2C, if a violation of a cross condition is found, search mode is indicated and the time step for the crossing time point is predicted.

If search mode is not indicated 220 after the cross conditions are checked, the nonlinear devices in the circuit model are evaluated 224 based on the current solution $\bar{v}_m^k$ and any necessary updates to the NAEs are made based on the evaluations. The currents, charges, conductances, capacitances, etc. of each device or component in the circuit model are expressed as functions of the vector of solution variables $\bar{v}$ in the NAEs and may need to be changed to reflect the current solution $\bar{v}_m^k$.

After the nonlinear devices are evaluated, a linear system of equations is formed from the NAEs 226. More specifically, the NAEs are linearized around the current solution $\bar{v}_m^k$. Any suitable technique for forming the linear system of equations may be used. The linear system of equations is then solved 228 to determine an update $\Delta\bar{v}_m^{k+1}$ to the current solution $\bar{v}_m^k$ as shown in Eq. (11).

$$\Delta\bar{v}_m^{k+1} = \bar{J}_{ckt}^{-1}(-\bar{f}_{ckt}) \qquad (11)$$

The solution $\Delta\bar{v}_m^{k+1}$ for the time point is then computed as the sum of the current solution $\bar{v}_m^k$ and the update $\Delta\bar{v}_m^{k+1}$ as shown in Eq. (12).

$$\bar{v}_m^{k+1} = \bar{v}_m^k + \Delta\bar{v}_m^{k+1} \qquad (12)$$

Search mode is not currently indicated 230, so the solution $\bar{v}_m^{k+1}$ is checked for convergence 234. Checking for convergence includes determining whether the updated solution $\bar{v}_m^{k+1}$ is within a predetermined tolerance of the solution found in the previous iteration $\bar{v}_m^k$ (or, in the initial iteration, if the updated solution is within the predetermined tolerance of the initial guess for the solution). The predetermined tolerance may be specified by a user of the circuit simulation. In one or more embodiments of the invention, a second convergence criterion is also checked. The second criterion requires that Kirchhoff's Flow Law is adequately satisfied by the updated solution. If the solution has converged 236, the method terminates and returns an indication of convergence. If the solution has not converged 236, another iteration is performed (unless the maximum number of iterations has been performed 216).

As is explained in more detail below in reference to FIG. 2C, if search mode is indicated 220 after the cross conditions are checked, the current time point $t_m$ at which the NAEs are to be solved is switched to the crossing time point and the time step $h_m{}^k$ is the time step predicted for the crossing time point, i.e., the predicted crossing time step. The time-varying input sources and the time integration coefficients of the NAEs are updated 222 based on the new predicted value of the time step $h_m{}^k$. The nonlinear devices in the circuit model are then evaluated 224 based on the current solution $\bar{v}_m{}^k$ and any necessary updates to the NAEs are made based on the evaluations. After the nonlinear devices are evaluated, a linear system of equations is formed from the NAEs 226 as previously described and the linear system of equations is solved 228 to determine an update $\Delta \bar{v}_m{}^{k+1}$ to the current solution $\bar{v}_m{}^k$ as shown in Eq. (11).

Because search mode is indicated 230, the cross condition is then solved 232. A method for solving the cross condition is described below in relation to FIG. 2D. In general, to solve the cross condition, the equation for the cross condition is solved jointly with the NAEs as a coupled nonlinear system in which the crossing time step, i.e., the time step from the time point accepted immediately prior to the violation of the cross condition, i.e., the previous time point, to the crossing time point is treated as an unknown. The result of solving the cross condition is an updated time step $h_m{}^{k+1}$ for the crossing time point (now the current time point) and an updated solution $\bar{v}_m{}^{k+1}$ of the NAEs at the crossing time point.

The updated solution $\bar{v}_m{}^{k+1}$ is then checked for convergence 234 as previously described. In search mode, the error between estimated crossing point and actual crossing point is also checked against tolerances 234. If the solution has converged and the error for the crossing time point is within tolerances 236, the method terminates and returns an indication of convergence. If the solution has not converged or the error for the crossing point is not within tolerances 236, another iteration is performed (unless the maximum number of iterations has been performed 216). Note that in the subsequent iteration (as long as another violation of a cross condition is not detected when the cross conditions are checked 218), the current time point $t_m$ is the crossing time point and the NAEs for the circuit will be solved for the crossing time point. In addition, the time step $h_m{}^k$ for the crossing time point is refined jointly with the solving the NAEs, i.e., the cross condition is solved. Also, if a new violation of a cross condition is detected 218 in the next iteration, the method will switch to generate a new crossing time point at a new crossing time step.

In some embodiments of the invention, when a cross condition is violated, the time point needs to be placed after the crossing within some tolerance rather than before the crossing. For example, the cross function in Verilog-A requires this placement. To meet this requirement, the above method is modified to ensure the estimated crossing time point is after the actual crossing time point. One modification used is to change the cross condition, equation (3), as shown below, $$f_{newcross}(\bar{v}_m) = f_{cross}(\bar{v}_m) \pm \epsilon = 0,$$

where $\epsilon$ is a fraction of the expression tolerance (or maximum allowable error for the cross expression).

Figure 2C:
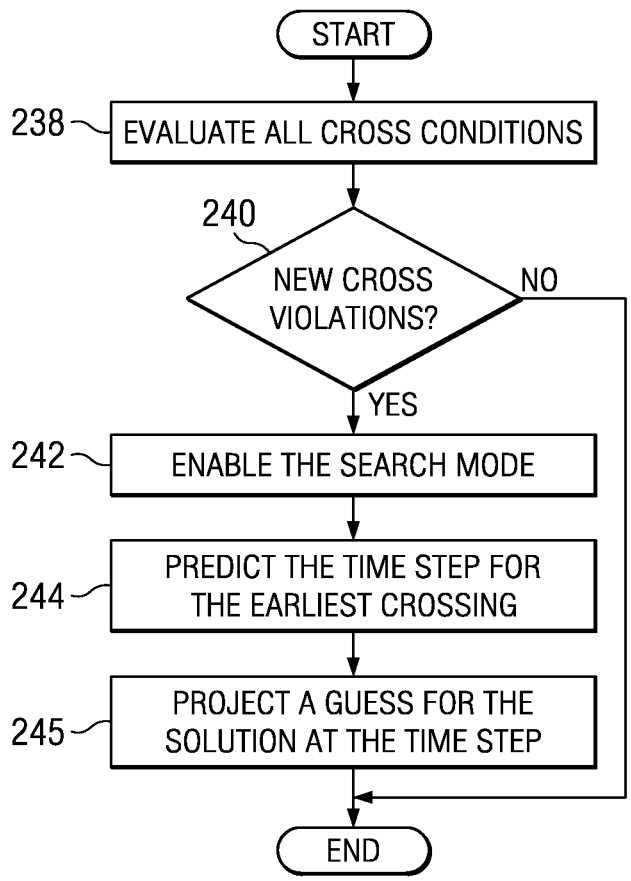

FIG. 2C is a flow graph of a method for checking cross conditions during the generation of the current time point $t_m$ in accordance with one or more embodiments of the invention. Initially, all cross conditions for all threshold crossing events specified in the circuit model are evaluated 238. As was previously discussed, a cross condition is defined as a crossing function $f_{cross}$ of the solution variables as shown in Eq. (3). To detect a cross violation, polynomial interpolation is used to find the maximum or minimum value of the crossing function $f_{cross}$ between the previous time point $t_{m-1}$ and the current time point $t_m$, i.e., to find the maximum or minimum value within the current time step $h_m$. The polynomial used is based on the current time point $t_m$ and the previous time point(s) $t_{m-1}$ ($t_{m-2}$ ...) and the order of the polynomial depends on the number of points to be used for approximating the value. Whether the interpolated value is a maximum or a minimum depends on the direction of the crossing. If there is a sign change between the solution to the crossing function $f_{cross}$ at the previous time point $t_{m-1}$ and the interpolated maximum or minimum value of the crossing function $f_{cross}$ between the previous time point $t_{m-1}$ and the current time point $t_m$, a violation of the cross condition is detected.

In one or more embodiments of the invention, a second order polynomial is used to find the maximum or minimum value of the crossing function $f_{cross}$. The three time points used are the current time point $t_m$ and the two previous time points $t_{m-1}$ and $t_{m-2}$. The second order polynomial is generated as shown in Eq. (13), $$f_{cross}(t) \approx a(t-t_{m-1})^2 + b(t-t_{m-1}) + f_{m-1} \tag{13}$$

where t is a time point between the previous time point and the current time point, $$a = \frac{\frac{f_m - f_{m-1}}{h_m} + \frac{f_{m-2} - f_{m-1}}{h_{m-1}}}{h_{m-1} + h_m},$$

$$b = \frac{\frac{h_{m-1}}{h_m}(f_m - f_{m-1}) - \frac{h_m}{h_{m-1}}(f_{m-2} - f_{m-1})}{h_{m-1} + h_m},$$

and $f_m$, $f_{m-1}$, and $f_{m-2}$ are the values of the crossing function $f_{cross}$ at $t_m$, $t_{m-1}$, and $t_{m-2}$. The time point for the maximum or minimum value, $t_{max/min}$, can be computed as shown in Eq. (14) and the value of the crossing function $f_{cross}$ at $t_{max/min}$, $f_{max/min}$, can be computed as shown in Eq. (15).

$$t_{max/min} = t_{m-1} - \frac{b}{2a} \tag{14}$$

$$f_{max/min} = f_{m-1} - \frac{b^2}{4a} \tag{15}$$

If the signs of $f_{max/min}$ and $f_{m-1}$ are different, a violation of the cross condition defined by $f_{cross}$ is detected.

If new violations of cross conditions are not detected 240, the method terminates. If new violations of cross conditions are detected, search mode is enabled 242. Search mode in this context is an indicator, e.g., a Boolean flag, which indicates that a violation of a cross condition has been detected and that a solution $\bar{v}_m$ should be found for a crossing time point rather than the current time point $t_m$. Note that once the search mode indicator is set during an iteration of the method of FIG. 2B, it remains set for the subsequent iterations.

A new time step $h_m{}^k$ is then predicted 244. If multiple cross conditions have been violated, the new time step $h_m{}^k$ is predicted for the earliest crossing point. This new time step $h_m{}^k$ is the interval between the previous time point $t_{m-1}$ and the crossing time point. In one or more embodiments of the invention, the new time step $h_m{}^k$ is predicted based on the polynomial generated for the crossing function $f_{cross}$ when evaluating the cross condition. In some embodiments of the invention, the new time step $h_m^k$ is computed as shown in Eq. (16).

$$h_{cross} = \frac{-b \pm \sqrt{b^2 - 4af_{m-1}}}{2a} \quad (16)$$

A guess for the solution $\bar{v}_m^k$ at the new time step $h_m^k$ is also projected 245.

Figure 2D:
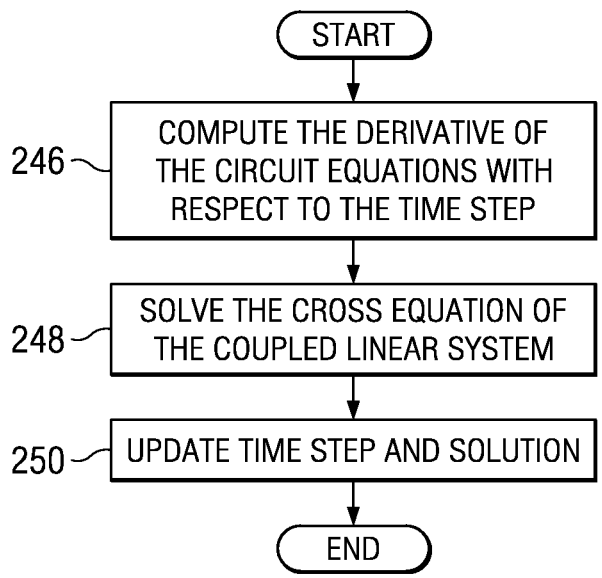

FIG. 2D is a flow graph of a method for solving the cross condition at the crossing time point in accordance with one or more embodiments of the invention. To solve the cross condition, the equations for the cross condition are solved jointly with the NAEs as a coupled nonlinear system in which the crossing time step is treated as an unknown. First, the derivatives of the circuit equations with respect to the current time step $h_m^k$, i.e., $$\frac{\partial \bar{f}_{ckt}}{\partial h_m^k},$$

are computed 246. When the backward Euler time integration is used, $$\frac{\partial \bar{f}_{ckt}}{\partial h_m^k}$$

is computed as shown in Eq. (17).

$$\frac{\partial \bar{f}_{ckt}}{\partial h_m^k} = \frac{-1}{h_m^{k2}} (\bar{q}(\bar{v}_m^k) - \bar{q}(\bar{v}_{m-1}^{k-1})) \quad (17)$$

Once the derivatives are computed, the cross equation of the coupled linear system is solved using the derivatives to obtain an update $\Delta \bar{v}_m^{k+1}$ of the current solution $\bar{v}_m^k$ and an update $\Delta h_m^{k+1}$ to the time step $h_m^k$ for the crossing time point. These updates are computed as per Eqs. (9) and (10). Note that the first term $\bar{J}_{ckt}^{-1}(-\bar{f}_{ckt})$ in Eq. (10) was computed when the linear system was solved and the derivatives of the cross function $f_{cross}$ with respect to the current solution $$\bar{v}_m^k, \frac{\partial f_{cross}}{\partial \bar{v}_m},$$

were computed when the cross conditions were checked.

The current time step $h_m^k$ and the current solution $\bar{v}_m^k$ are then updated to obtain the solution for the current time point $\bar{v}_m^{k+1}$ and the time step $h_m^{k+1}$ for the current time point. The solution for the current time point $\bar{v}_m^{k+1}$ is computed as shown in Eq. (12) and the step for the current time point is computed as shown in Eq. (18).

$$h_m^{k+1} = h_m^k + \Delta h_m^{k+1} \quad (18)$$

Figure 3:
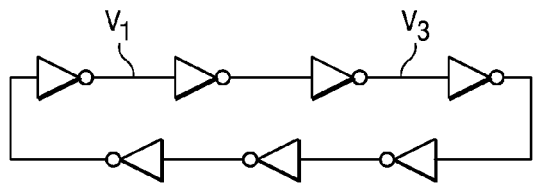
FIG. 3 shows a circuit in accordance with one or more embodiments of the invention.

The methods described above was implemented in a Spice-like circuit simulator and tested on a model of a seven-stage ring oscillator as shown in FIG. 3. Three cross conditions were tested: $v_1 = 2$, $v_1 = v_3$, and $$\frac{V_1^2}{1 k\Omega} = 4 \text{ mW}.$$

Figure 4:
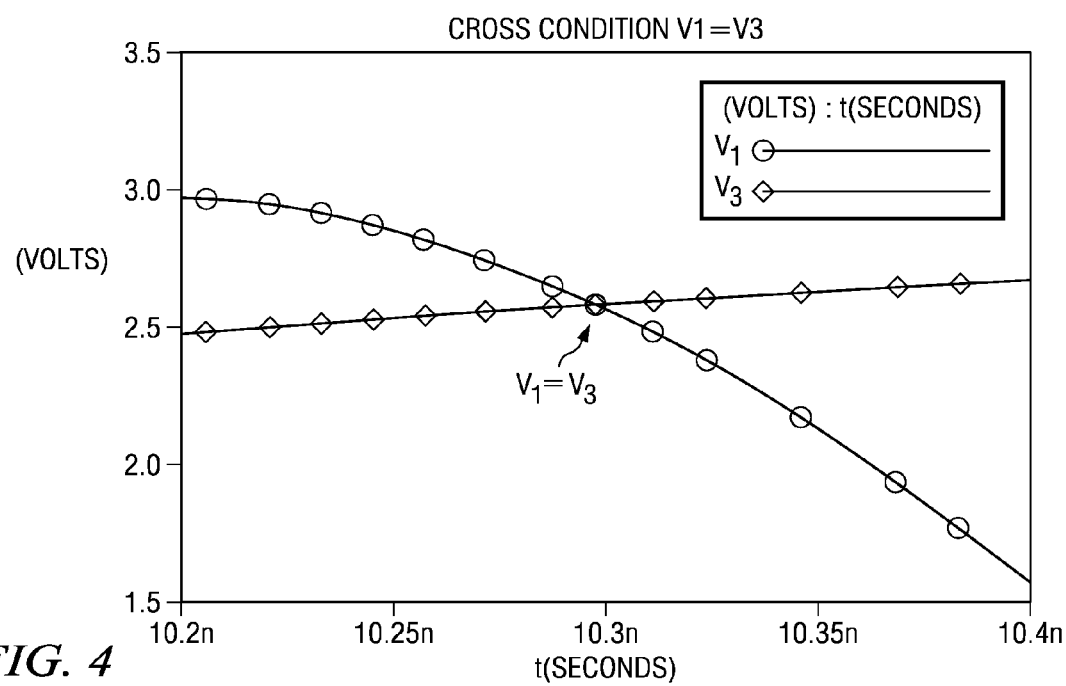
FIG. 4 shows a graph of the threshold-crossing for a cross condition specified for the circuit of FIG. 3 in accordance with one or more embodiments.

The expression tolerance for the crossing condition was set to 1e-6 and the time tolerance for the crossing point was set to 1e-14. The second-order Gear time integration scheme was used for time integration. The zero-crossing for the condition $f_{cross} = V_1 - V_3$ is shown in FIG. 4. The results of these tests showed a very good convergence rate for all three cross conditions—on average, less than two extra Newton iterations were required to locate the crossing, while the best known method for locating a crossing typically requires 2-4 extra time points with 2-4 Newton iterations per time point. The average numbers of extra Newton iterations executed to locate the crossing time point for each of the conditions tested is summarized in Table 1.

TABLE 1

| cross condition | average # of Newton iterations at the crossing | average # of extra Newton iterations at the crossing |
| --- | --- | --- |
| $V_1 = 2$ | 3.2 | 1.1 |
| $V_1 = V_3$ | 3.5 | 1.4 |
| $\frac{V_1^2}{1 k\Omega} = 4$ mW | 3.4 | 1.3 |

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims. It is therefore contemplated that the appended claims will cover any such modifications of the embodiments as fall within the true scope and spirit of the invention.

What is claimed is:

1. A computer-implemented method for simulation of a model of a system, the method comprising:
    detecting, by using the computer, a violation of a cross condition while iteratively refining a first solution of a system of nonlinear algebraic equations at a current time point, wherein the system of nonlinear algebraic equations is derived from a set of nonlinear differential algebraic equations that describe the system;
    responsive to the detecting,
        predicting a crossing time step, wherein the crossing time step is an interval between a previous time point and a crossing time point where the crossing condition was violated;
        projecting an initial guess for a second solution of the system of nonlinear algebraic equations at the crossing time point; and
        iteratively refining the second solution and the crossing time step by jointly solving an equation for the cross condition with the system of nonlinear algebraic equations as a coupled nonlinear system in which the crossing time step is treated as an unknown to compute changes to the second solution and the crossing time step in each iteration; and outputting information regarding the second solution and the crossing time point in human readable form.

2. The method of claim 1, wherein jointly solving further comprises computing a solution to the system of nonlinear algebraic equations at the crossing time point.

3. The method of claim 1, wherein jointly solving further comprises computing derivatives of the nonlinear differential algebraic equations with respect to the crossing time step.

4. The method of claim 1, wherein jointly solving further comprises computing derivatives of the equations for the cross condition with respect to the second solution.

5. The method of claim 1, wherein detecting a violation further comprises: using polynomial interpolation to find a value of the equation for the cross condition between the current time point and the previous time point, wherein the value is selected from a group consisting of maximum value and a minimum value; and detecting the violation of the cross condition if there is a sign change between a solution of the equation for the cross condition at the previous time point and the value.

6. The method of claim 5, wherein predicting a crossing time step further comprises predicting the crossing time step based on a polynomial generated for the polynomial interpolation.

7. The method of claim 1, wherein the system is a circuit.

8. A non-transitory computer readable medium comprising executable instructions to perform a method for simulation of a model of a system when executed by a processor, the method comprising:
    detecting, by using the processor, a violation of a cross condition while iteratively refining a first solution of a system of nonlinear algebraic equations at a current time point, wherein the system of nonlinear algebraic equations is derived from a set of nonlinear differential algebraic equations that describe the system;
    responsive to the detecting,
        predicting a crossing time step, wherein the crossing time step is an interval between a previous time point and a crossing time point where the crossing condition was violated;
        projecting an initial guess for a second solution of the system of nonlinear algebraic equations at the crossing time point; and
        iteratively refining the second solution and the crossing time step by jointly solving an equation for the cross condition with the system of nonlinear algebraic equations as a coupled nonlinear system in which the crossing time step is treated as an unknown to compute changes to the second solution and the crossing time step in each iteration; and outputting information regarding the second solution and the crossing time point in human readable form.

9. The computer readable medium of claim 8, wherein jointly solving further comprises computing a solution to the system of nonlinear algebraic equations at the crossing time point.

10. The computer readable medium of claim 8, wherein jointly solving further comprises computing derivatives of the nonlinear differential algebraic equations with respect to the crossing time step.

11. The computer readable medium of claim 8, wherein jointly solving further comprises computing derivatives of the equations for the cross condition with respect to the second solution.

12. The computer readable medium of claim 8, wherein detecting a violation further comprises: using polynomial interpolation to find a value of the equation for the cross condition between the current time point and the previous time point, wherein the value is selected from a group consisting of maximum value and a minimum value; and detecting the violation of the cross condition if there is a sign change between a solution of the equation for the cross condition at the previous time point and the value.

13. The computer readable medium of claim 12, wherein predicting a crossing time step further comprises predicting the crossing time step based on a polynomial generated for the polynomial interpolation.

14. The computer readable medium of claim 8, wherein the system is a circuit.

15. A computer system comprising:
    a processor; and a storage device storing software instructions, wherein when executed by the processor, the software instructions cause the computer system to perform a method for simulation of a model of a system, the method comprising:
    detecting, by using the processor, a violation of a cross condition while iteratively refining a first solution of a system of nonlinear algebraic equations at a current time point, wherein the system of nonlinear algebraic equations is derived from a set of nonlinear differential algebraic equations that describe the system;
    responsive to the detecting,
        predicting a crossing time step, wherein the crossing time step is an interval between a previous time point and a crossing time point where the crossing condition was violated;
        projecting an initial guess for a second solution of the system of nonlinear algebraic equations at the crossing time point; and
        iteratively refining the second solution and the crossing time step by jointly solving an equation for the cross condition with the system of nonlinear algebraic equations as a coupled nonlinear system in which the crossing time step is treated as an unknown to compute changes to the second solution and the crossing time step in each iteration; and outputting information regarding the second solution and the crossing time point in human readable form.

16. The computer system of claim 15, wherein jointly solving further comprises computing a solution to the system of nonlinear algebraic equations at the crossing time point.

17. The computer system of claim 15, wherein jointly solving further comprises computing derivatives of the nonlinear differential algebraic equations with respect to the crossing time step.

18. The computer system of claim 15, wherein jointly solving further comprises computing derivatives of the equations for the cross condition with respect to the second solution.

19. The computer system of claim 15, wherein detecting a violation further comprises: using polynomial interpolation to find a value of the equation for the cross condition between the current time point and the previous time point, wherein the value is selected from a group consisting of maximum value and a minimum value; and detecting the violation of the cross condition if there is a sign change between a solution of the equation for the cross condition at the previous time point and the value.

20. The computer system of claim 19, wherein predicting a crossing time step further comprises predicting the crossing time step based on a polynomial generated for the polynomial interpolation.

* * * * *